(12) United States Patent
Yu et al.

(10) Patent No.: US 11,455,926 B2
(45) Date of Patent: Sep. 27, 2022

(54) DRIVE CONTROL METHOD AND ASSEMBLY, AS WELL AS DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Shuhuan Yu, Beijing (CN); Xin Duan, Beijing (CN); Hsinchung Lo, Beijing (CN)

(73) Assignees: Beijing BOE Display Technology Co., Ltd., Beijing (CN); Beijing BOE Technology Development Co., Ltd., Beijing (CN)

(*) Notice: Subject to any disclaimer, the term of this patent is extended or adjusted under 35 U.S.C. 154(b) by 755 days.

(21) Appl. No.: 16/339,419

(22) PCT Filed: Nov. 20, 2018

(86) PCT No.: PCT/CN2018/116430
§ 371 (c)(1),
(2) Date: Apr. 4, 2019

(87) PCT Pub. No.: WO2019/165804
PCT Pub. Date: Sep. 6, 2019

(65) Prior Publication Data
US 2021/0358359 A1 Nov. 18, 2021

(30) Foreign Application Priority Data
Mar. 1, 2018 (CN) .......................... 201810172362.7

(51) Int. Cl.
*G09G 3/20* (2006.01)
*H03M 5/12* (2006.01)

(52) U.S. Cl.
CPC ................. *G09G 3/20* (2013.01); *H03M 5/12* (2013.01); *G09G 2310/0275* (2013.01); *G09G 2310/08* (2013.01); *G09G 2360/12* (2013.01)

(58) Field of Classification Search
CPC ....... G09G 2310/0275; G09G 2310/08; G09G 2360/12; G09G 3/20; H03M 5/12
See application file for complete search history.

(56) References Cited

U.S. PATENT DOCUMENTS

2004/0135758 A1  7/2004  Morita
2005/0005049 A1  1/2005  Montalvo et al.
(Continued)

FOREIGN PATENT DOCUMENTS

CN    1503217 A      6/2004
CN  101572047 A     11/2009
(Continued)

OTHER PUBLICATIONS

Search Report and Written Opinion for International Application No. PCT/CN2018/116430 dated Jan. 30, 2019.
(Continued)

*Primary Examiner* — Lixi C Simpson
(74) *Attorney, Agent, or Firm* — Calfee, Halter & Griswold LLP

(57) ABSTRACT

A drive control method, assembly, and a display device. The method is applied to a timer controller. The method comprises: generating a point-to-point configuration instruction that comprises n configuration data where n≥2; sending the point-to-point configuration instruction to a first source driver chip through a first signal line, the first source driver chip being any one of a plurality of source driver chips; and receiving a configuration response instruction sent by the first source driver chip according to the point-to-point configuration instruction through the first signal line, the con-
(Continued)

figuration response instruction comprising configuration response data for each of the n configuration data.

17 Claims, 6 Drawing Sheets

(56) References Cited

U.S. PATENT DOCUMENTS

| | | |
|---|---|---|
| 2009/0168729 A1 | 7/2009 | Sun et al. |
| 2009/0219276 A1 | 9/2009 | Hirama |
| 2010/0156879 A1 | 6/2010 | Jincheol et al. |
| 2011/0037758 A1* | 2/2011 | Lim .................... H03L 7/0805 345/213 |
| 2012/0154356 A1 | 6/2012 | Hsu et al. |
| 2014/0118235 A1* | 5/2014 | Hong .................... G09G 5/008 345/87 |
| 2017/0092222 A1 | 3/2017 | Tae et al. |
| 2017/0154597 A1 | 6/2017 | Iwami |
| 2018/0090093 A1 | 3/2018 | Wang |
| 2019/0066565 A1 | 2/2019 | Guo |
| 2019/0066612 A1 | 2/2019 | Wang |

FOREIGN PATENT DOCUMENTS

| | | |
|---|---|---|
| CN | 101763832 A | 6/2010 |
| CN | 103198803 A | 7/2013 |
| CN | 103794184 A | 5/2014 |
| CN | 105609068 A | 5/2016 |
| CN | 107507584 A | 12/2017 |
| CN | 107610658 A | 1/2018 |
| EP | 1498823 A2 | 1/2005 |
| EP | 1498823 B1 | 1/2005 |
| TW | 201227657 A | 7/2012 |

OTHER PUBLICATIONS

Office Action from Chinese Application No. 201810172362.7 dated Oct. 19, 2021.
Extended European Search Report from European Application No. 18863789.6 dated Sep. 22, 2021.
Communication Pursuant to 70(2) and 70a(2) EPC from European Application No. 18863789.6 dated Oct. 12, 2021.
Anonymous: "The I2C specification 2.1 ", Jan. 1, 2000,, Jan. 1, 2000 (Jan. 1, 2000), XP030001520.

* cited by examiner

DRIVE CONTROL METHOD AND ASSEMBLY, AS WELL AS DISPLAY DEVICE

RELATED APPLICATIONS

The present application is the U.S. national phase entry of PCT/CN2018/116430, with an international filling date of Nov. 20, 2018, which claims the benefit of Chinese Patent Application No. 201810172362.7, filed on Mar. 1, 2018, the entire disclosure of which is incorporated herein by reference.

FIELD

The present disclosure relates to the field of display panel manufacturing, and more particularly to a drive control method and assembly, as well as a display device.

BACKGROUND

A display device generally may comprise a display panel and a panel driver circuit configured to drive the display panel. The driver circuit may comprise a timer controller (TCON) and a source driver circuit comprising a plurality of source driver chips.

The panel driver circuit generally comprises two kinds of signal lines. The two kinds of signal lines comprise a first signal line and a second signal line. The first signal line has a signal transmission rate smaller than that of the second signal line. The first signal line is called a low-speed signal line, which is usually configured to transmitting a configuration instruction. The second signal line is called a high-speed signal line, which is usually configured to transmitting a high-speed differential signal. In a panel driving process, a point-to-point high-speed signal transmission technology is usually adopted for signal transmission, which is characterized in that a second signal line is established between a timer controller and a source driver chip in a one-to-one relationship so as to transmit a high-speed differential signal. Moreover, the timer controller is further provided with an additional first signal line. A plurality of source driver chips is connected in parallel to the first signal line. The first signal line is configured to transmitting a configuration instruction so as to cooperate with the second signal line to transmit the high-speed differential signal.

However, the first signal line has a lower transmission efficiency and lower utilization rate.

SUMMARY

The present disclosure provides a drive control method and assembly, as well as a display device.

In an exemplary embodiment a drive control method applied to a timer controller. The timer controller communicates with a plurality of source driver chips connected in parallel through a first signal line. The method comprises: generating a point-to-point configuration instruction that comprises n configuration data, n≥2; sending the point-to-point configuration instruction to a first source driver chip through the first signal line, the first source driver chip being any one of the plurality of source driver chips; and receiving a configuration response instruction sent by the first source driver chip according to the point-to-point configuration instruction through the first signal line, the configuration response instruction comprising configuration response data for each of the n configuration data.

In some exemplary embodiments, the point-to-point configuration instruction comprises addresses used for the n configuration data, a first indicator and a data portion. The first indicator is configured to indicate whether the addresses used for the n configuration data are consecutive. The data portion carries the n configuration data.

In some exemplary embodiments, when the first indicator indicates the addresses used for the n configuration data are consecutive, the addresses used for the n configuration data comprise the first address and the last address of the consecutive addresses.

In some exemplary embodiments, the point-to-point configuration instruction further comprises a second indicator. The second indicator is configured to indicate the number of configuration data in the point-to-point configuration instruction.

In some exemplary embodiments, the point-to-point configuration instruction comprises at least five bytes. The first indicator comprises the fifth bit of the third byte among the at least five bytes. The second indicator comprises the sixth bit to the eighth bit of the third byte.

In some exemplary embodiments, the timer controller connects with the plurality of source driver chips respectively in a one-to-one relationship through a plurality of second signal lines, and the timer controller connects with the first source driver chip through a target second signal line of the plurality of second signal lines that is assigned to the first source driver chip. Before generating a point-to-point configuration instruction, the method further comprises: sending a start instruction to the first source driver chip through the assigned second signal line for indicating the largest number of configuration data carried by the point-to-point configuration instruction.

In some exemplary embodiments, the start instruction comprises at least seven bytes. Four bits of the seventh byte among the at least seven bytes are configured to indicate the largest number.

In some exemplary embodiments, the point-to-point configuration instruction and the configuration response instruction each comprise a preamble, a start identifier, a data body and a stop identifier that are sequentially arranged. The preamble comprises a first signal of at least eight consecutive bit periods, each of the bit periods being two microseconds. The start identifier comprises a second signal of at least two consecutive bit periods. The data body comprises the n configuration data or n configuration response data. The stop identifier comprises a third signal of at least two consecutive bit periods. The first signal, the second signal, the n configuration data and the configuration response data thereof are all obtained by Manchester encoding.

In another exemplary embodiment, there is provided a drive control method applied to a first source driver chip. The first source driver chip is any one of a plurality of source driver chips. The plurality of source driver chips is connected in parallel and communicates with a timer controller through a first signal line. The method comprises: receiving a point-to-point configuration instruction sent by the timer controller through the first signal line, the point-to-point configuration instruction comprising: n configuration data used for a first source driver chip, n≥2; and sending a configuration response instruction to the timer controller according to the point-to-point configuration instruction through the first signal line, the configuration response instruction comprising configuration response data for each of the n configuration data.

In some exemplary embodiments, the point-to-point configuration instruction comprises addresses used for the n configuration data, a first indicator and a data portion. Before sending a configuration response instruction to the timer controller according to the point-to-point configuration instruction through the first signal line, the method further comprises: acquiring a value of the first indicator, the first indicator being configured to indicate whether the addresses used for the n configuration data are consecutive, the data portion carrying the n configuration data; acquiring target addresses from the addresses used for the n configuration data according to the value of the first indicator, wherein when the first indicator indicates the addresses used for the n configuration data are consecutive, the addresses used for the n configuration data comprise the first address and the last address of the consecutive addresses, and the acquired target addresses comprise a segment of consecutive addresses delimited by the first address and the last address; and when the first indicator indicates the addresses used for the n configuration data are not consecutive, the acquired target addresses comprise the address of each of the n configuration data; and acquiring the n configuration data carried by the data portion according to reference information, the reference information comprising the target addresses.

In some exemplary embodiments, the point-to-point configuration instruction further comprises a second indicator. Before acquiring the n configuration data carried by the data portion according to reference information, the method further comprises: acquiring a value of the second indicator, the second indicator being configured to indicate the number of configuration data in the point-to-point configuration instruction; and determining the number according to the value of the second indicator, the reference information further comprising the number.

In some exemplary embodiments, the point-to-point configuration instruction comprises at least five bytes. The first indicator comprises the fifth bit of the third byte among the at least five bytes. The second indicator comprises the sixth bit to the eighth bit of the third byte among the at least five bytes.

In some exemplary embodiments, the timer controller connects with the plurality of source driver chips respectively in a one-to-one relationship through a plurality of second signal lines, and the timer controller connects with the first source driver chip through a target second signal line of the plurality of second signal lines that is assigned to the first source driver chip. Before sending a configuration response instruction to the timer controller according to the point-to-point configuration instruction through the first signal line, the method further comprises: receiving a start instruction sent by the timer controller through the assigned second signal line, the start instruction being configured to indicate the largest number of configuration data carried by the point-to-point configuration instruction.

In some exemplary embodiments, the start instruction comprises at least seven bytes. Four bits of the seventh byte among the at least seven bytes are configured to indicate the largest number.

In some exemplary embodiments, the point-to-point configuration instruction and the configuration response instruction each comprise a preamble, a start identifier, a data body and a stop identifier that are sequentially arranged. The preamble comprises a first signal of at least eight consecutive bit periods, each of the bit periods being two microseconds. The start identifier comprises a second signal of at least two consecutive bit periods. The data body comprises the n configuration data or n configuration response data. The stop identifier comprises a third signal of at least two consecutive bit periods. The first signal, the second signal, the n configuration data and the configuration response data thereof are all obtained by Manchester encoding.

In another exemplary embodiment, there is provided a drive control assembly applied to a timer controller. The timer controller communicates with a plurality of source driver chips connected in parallel through a first signal line. The drive control assembly comprises a generation module configured to generate a point-to-point configuration instruction that comprises n configuration data, n≥2; a first sending module configured to send the point-to-point configuration instruction to a first source driver chip through the first signal line, the first source driver chip being any one of the plurality of source driver chips; and a receiving module configured to receive a configuration response instruction sent by the first source driver chip according to the point-to-point configuration instruction through the first signal line, the configuration response instruction comprising configuration response data for each of the n configuration data.

In some exemplary embodiments, the point-to-point configuration instruction comprises addresses used for the n configuration data, a first indicator and a data portion. The first indicator is configured to indicate whether the addresses used for the n configuration data are consecutive. The data portion carries the n configuration data.

In some exemplary embodiments, when the first indicator indicates the addresses used for the n configuration data are consecutive, the addresses used for the n configuration data comprise the first address and the last address of the consecutive addresses.

In some exemplary embodiments, the point-to-point configuration instruction further comprises a second indicator. The second indicator is configured to indicate the number of configuration data in the point-to-point configuration instruction.

In some exemplary embodiments, the point-to-point configuration instruction comprises at least five bytes. The first indicator comprises the fifth bit of the third byte among the at least five bytes. The second indicator comprises the sixth bit to the eighth bit of the third byte.

In some exemplary embodiments, the timer controller connects with the plurality of source driver chips respectively in a one-to-one relationship through a plurality of second signal lines, and the timer controller connects with the first source driver chip through a target second signal line of the plurality of second signal lines that is assigned to the first source driver chip. The drive control assembly further comprises a second sending module configured to send a start instruction to the first source driver chip through the assigned second signal line, the start instruction being configured to indicate the largest number of configuration data carried by the point-to-point configuration instruction.

In some exemplary embodiments, the start instruction comprises at least seven bytes. Four bits of the seventh byte among the at least seven bytes are configured to indicate the largest number.

In some exemplary embodiments, the point-to-point configuration instruction and the configuration response instruction each comprise a preamble, a start identifier, a data body and a stop identifier that are sequentially arranged. The preamble comprises a first signal of at least eight consecutive bit periods, each of the bit periods being two microseconds. The start identifier comprises a second signal of at least two consecutive bit periods. The data body comprises the n configuration data or n configuration response data. The stop identifier comprises a third signal of at least two consecutive bit periods. The first signal, the second signal, the n configuration data and the configuration response data thereof are all obtained by Manchester encoding.

In another exemplary embodiment, there is provided a drive control assembly applied to a first source driver chip. The first source driver chip is any one of a plurality of source driver chips. The plurality of source driver chips is connected in parallel and communicates with a timer controller through a first signal line. The drive control assembly comprises: a first receiving module configured to receive a point-to-point configuration instruction sent by the timer controller through the first signal line, the point-to-point configuration instruction comprising: n configuration data used for a first source driver chip, n≥2; and a sending module configured to send a configuration response instruction to the timer controller according to the point-to-point configuration instruction through the first signal line, the configuration response instruction comprising configuration response data for each of the n configuration data.

In some exemplary embodiments, the point-to-point configuration instruction comprises addresses used for the n configuration data, a first indicator and a data portion. The drive control assembly further comprises: a first acquisition module configured to acquire a value of the first indicator, the first indicator being configured to indicate whether the addresses used for the n configuration data are consecutive, the data portion carrying the n configuration data; a second acquisition module configured to acquire target addresses from the addresses used for the n configuration data according to the value of the first indicator, wherein when the first indicator indicates the addresses used for the n configuration data are consecutive, the addresses used for the n configuration data comprise the first address and the last address of the consecutive addresses, and the acquired target addresses comprise a segment of consecutive addresses delimited by the first address and the last address; and when the first indicator indicates the addresses used for the n configuration data are not consecutive, the acquired target addresses comprise the address of each of the n configuration data; and a third acquisition module configured to acquire the n configuration data carried by the data portion according to reference information, the reference information comprising the target addresses.

In some exemplary embodiments, the point-to-point configuration instruction further comprises a second indicator. The drive control assembly further comprises: a fourth acquisition module configured to acquire a value of the second indicator, the second indicator being configured to indicate the number of configuration data in the point-to-point configuration instruction; and a determination module configured to determine the number according to the value of the second indicator, the reference information further comprising the number.

In some exemplary embodiments, the point-to-point configuration instruction comprises at least five bytes. The first indicator comprises the fifth bit of the third byte among the at least five bytes. The second indicator comprises the sixth bit to the eighth bit of the third byte among the at least five bytes.

In some exemplary embodiments, the timer controller connects with the plurality of source driver chips respectively in a one-to-one relationship through a plurality of second signal lines, and the timer controller connects with the first source driver chip through a target second signal line of the plurality of second signal lines that is assigned to the first source driver chip. The drive control assembly further comprises: a second receiving module configured to receive a start instruction sent by the timer controller through the assigned second signal line, the start instruction being configured to indicate the largest number of configuration data carried by the point-to-point configuration instruction.

In some exemplary embodiments, the start instruction comprises at least seven bytes. Four bits of the seventh byte among the at least seven bytes are configured to indicate the largest number.

In some exemplary embodiments, the point-to-point configuration instruction and the configuration response instruction each comprise a preamble, a start identifier, a data body and a stop identifier that are sequentially arranged. The preamble comprises a first signal of at least eight consecutive bit periods, each of the bit periods being two microseconds. The start identifier comprises a second signal of at least two consecutive bit periods. The data body comprises the n configuration data or n configuration response data. The stop identifier comprises a third signal of at least two consecutive bit periods. The first signal, the second signal, the n configuration data and the configuration response data thereof are all obtained by Manchester encoding.

In another exemplary embodiment, there is provided a drive control assembly, comprising a memory, a processor and a computer program stored in the memory and executable in the processor, wherein when executing the computer program, the processor implements the steps of the method in the first aspect.

In another exemplary embodiment, there is provided a drive control assembly, comprising a memory, a processor and a computer program stored in the memory and executable in the processor, wherein when executing the computer program, the processor implements the steps of the method in the second aspect.

In another exemplary embodiment, there is provided a computer readable storage medium having a computer program stored thereon, wherein the program, when executed by the processor, implements the steps of the method in the first and second aspects.

In another exemplary embodiment, there is provided a display device. The display device comprises a timer controller and a source driver chip, wherein the timer controller comprises a drive control assembly in the third or fifth aspect, and the source driver chip comprises a drive control assembly in the fourth or sixth aspect.

In another exemplary embodiment, there is provided a chip comprising a programmable logic circuit and/or a program instruction that is configured to implementing the method in the first aspect when the chip operates.

In another exemplary embodiment, there is provided a chip comprising a programmable logic circuit and/or a program instruction that is configured to implementing the method in the second aspect when the chip operates.

It should be understood that the above general description and the following detailed description are merely exemplary and are not intended to limit the disclosure.

BRIEF DESCRIPTION OF DRAWINGS

The above and other aspects of the present disclosure will now be described in more detail with reference to the drawings, which illustrate the exemplary embodiments of the present disclosure.

The drawings herein, which are incorporated in the specification and constitute a part thereof, illustrate exemplary embodiments consistent with the present disclosure and are used, together with the specification, to explain the principles of the present disclosure.

DETAILED DESCRIPTION

For explanation, rather than limitation, the following description states some particular details of the disclosed exemplary embodiments, so that the present disclosure can be clearly and thoroughly understood. Those of ordinary skill in the art, however, should readily understand that, without seriously departing from the spirit and scope of the present disclosure, the present disclosure can be implemented according to other embodiments that do not precisely conform to the details described herein. Moreover, in the context, for the sake of brevity, detailed description of some known equipment, circuits and methods are omitted so as to avoid redundant details and possible confusions.

A panel driver circuit comprises a first signal line and second signal lines. A timer controller may transmit a configuration instruction through the first signal line so as to cooperate with the second signal lines for transmitting a high-speed differential signal. The configuration instruction comprises a preamble, a start identifier, data and a stop identifier. Since each instruction transmitted by the first signal line carries less data, a plurality of instructions are required to transmit a plurality of data, and more preambles, start identifiers as well as stop identifiers need to be transmitted during the transmission of the plurality of instructions, such that the first signal line has a lower transmission efficiency and utilization rate. The exemplary embodiments of the present disclosure provide a drive control method which is capable of enhancing the transmission efficiency and utilization rate of the first signal line.

Figure 1:
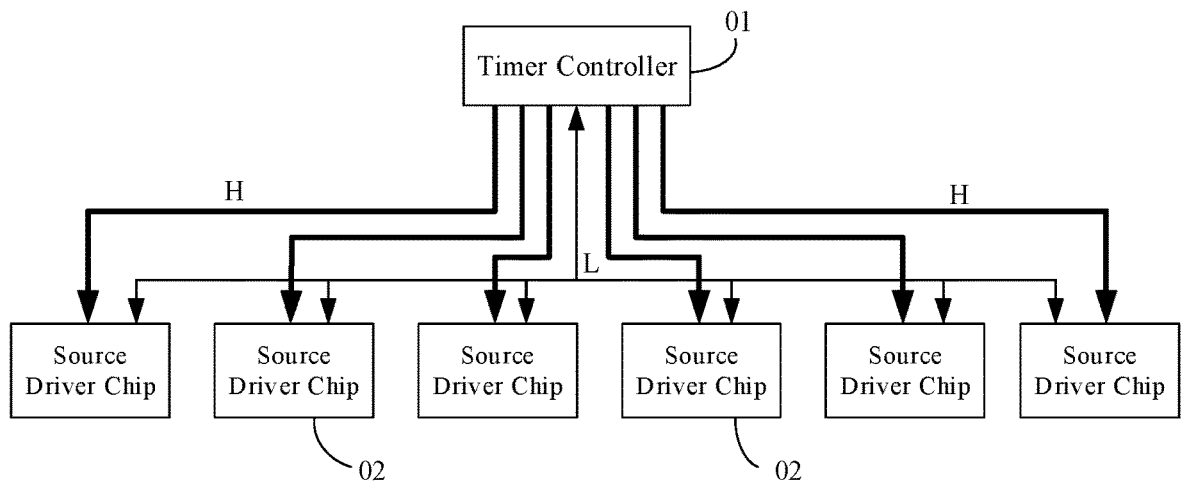
FIG. 1 is a schematic diagram showing an application scenario of a drive control method provided by an exemplary embodiment.

FIG. 1 is a schematic diagram showing an application scenario of a drive control method provided by an exemplary embodiment. As shown in FIG. 1, the drive control method is applied to a display device. The display device comprises a timer controller 01 and a plurality of source driver chips 02. The time controller 01 connects with the plurality of source driver chips 02 respectively through a plurality of second signal lines H. The timer controller 01 is generally connected with the plurality of source driver chips 02 in a one-to-one relationship through the plurality of second signal lines H, wherein the signals on the second signal lines are transmitted unidirectionally. The timer controller is further connected with a first signal line L. The plurality of source driver chips 02 is connected in parallel and with the first signal line L so as to communicate with the timer controller. The signal on the first signal line is transmitted bidirectionally.

In the panel driver circuit of the display device, the first signal line L may transmit different instructions so as to realize different data transmission functions. Each data transmission function corresponds to at least one transmission mode. For instance, the timer controller may achieve a function of sending a broadcast configuration instruction to the source driver chip through the first signal line, i.e., setting up an initialization procedure in all source driver chips. This function corresponds to a broadcast communication (BC) mode, i.e., the BC mode instructs the timer controller to conduct data broadcast. The time controller may also send identity configuration instructions to the source driver chips through the first signal line so as to realize the function of sending identification (ID) to the source driver chips. This function corresponds to an ID assignment (IA) mode, i.e., the IA mode instructs the timer controller to assign IDs to the source driver chips. The timer controller may also send a point-to-point (also called end-to-end) configuration instruction to a source driver chip through the first signal line so as to realize the function of the point-to-point control of the source driver chip. This function corresponds to a downstream communication (DC) mode, i.e., the DC mode instructs the timer controller to conduct point-to-point data transmission to a source driver chip. The source driver chip may send a control response instruction in response to the point-to-point configuration instruction to the timer controller through the first signal line, or send an identity configuration response instruction in response to the identity configuration instruction to the timer controller through the first signal line. This function corresponds to a reply transaction (RT) mode, i.e., the RT mode instructs a source driver chip to reply to the instruction of the timer controller. Through the cooperation of the above modes, the timer controller may sequentially perform such operations as the ID assignment of a source driver chip, read/write operations of data, and reception of data feedback from a source driver chip. It should be noted that the drive control method provided by the exemplary embodiment of the present disclosure may be applicable to the DC mode.

Figure 2:
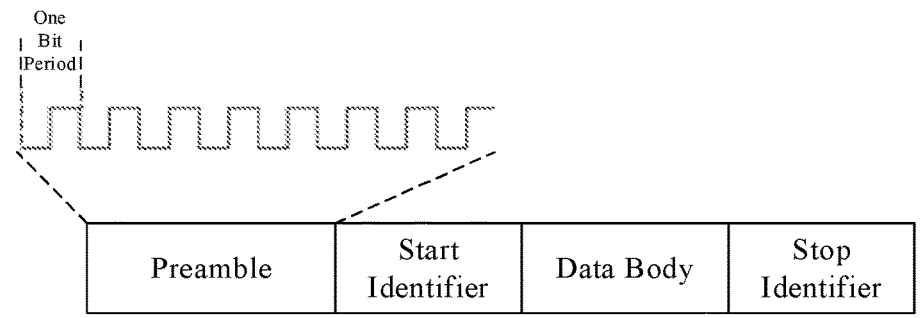
FIG. 2 is a schematic diagram showing an instruction transmitted on a first signal line provided by an exemplary embodiment.

Optionally, in an exemplary embodiment, formats of instructions transmitted on the first signal line L between a timer controller and a source driver chip are the same. FIG. 2 is a schematic diagram showing an instruction transmitted in a first signal line provided by an exemplary embodiment. As shown in FIG. 2, each instruction transmitted on the first signal line comprises a preamble, a start identifier, a data body (also called a transaction body) and a stop identifier that are arranged sequentially.

The preamble is used to instruct a receiving end to perform clock and phase calibration. When the receiving end (the timer controller or the source driver chip) detects that a preamble is being transmitted on the first signal line, it adjusts the clock and phase according to the content of the preamble. Clock and phase adjustment refers to keeping the clock at the receiving end consistent with the one at a transmitting end, and the phase at the receiving end consistent with that at the transmitting end. The receiving end adjusts the clock and phase during reception of the preamble. After transmission of the preamble finishes, the clock and phase adjustment is completed. The start identifier is configured to indicate the start of data transmission, the data body is used to carry the configuration data, and the stop identifier is configured to indicate the end of data transmission.

In the exemplary embodiment, the preamble may consist of a signal comprising regularly transitioning edges. Exemplarily, further with reference to FIG. 2, the preamble may comprise a first signal of at least eight consecutive bit periods, each of the bit periods being two microseconds. The start identifier may comprise a second signal of at least two consecutive bit periods. The stop identifier may comprise a third signal of at least two consecutive bit periods. The first signal, the second signal, and configuration data and configuration response data carried by the data body may all be obtained by Manchester encoding (such as a second version of Manchester encoding MII). In an example, transition of the first signal is from a low level to a high level, transition of the second signal is from a low level to a high level, and transition of the third signal is from a high level to a low level. It would be understood that in addition to the Manchester encoding, the start identifier and the stop identifier may also use a signal in other forms agreed between the transmitting end and the receiving end, including a signal that maintains a low level or a high level within a specified time period.

It should be noted that Manchester encoding may cause apparent transition edges in data for the sake of easy detection of data, so the data that need to be encoded in an exemplary embodiment may all adopt Manchester encoding. In an actual application, it may also be possible to adopt other encoding manner or not to use encoding. Moreover, in order to make sure that the configuration data carried by the data body can be effectively identified by a decoding end, with reference to FIG. 2, the first bit of the configuration data in the data body may produce a transition edge with the start identifier (namely, the first bit of the configuration data in the data body has a value different from the last bit of the start identifier. For instance, the first bit of the configuration data in the data body is 1, and the last bit of the start identifier is 0). The last bit of the configuration data in the data body may produce a transition edge with the stop identifier (namely, the last bit of the configuration data in the data body has a value different from the first bit of the stop identifier. For instance, the last bit of the configuration data in the data body is 0, and the last bit of the stop identifier is 0). The transition edge may facilitate effective data identification by the receiving end. In the event that there's only one first signal line, data transmission may be realized by Manchester encoding, in such a way to enrich the function of the first signal line and enhance the utilization rate of the first signal line.

Moreover, suppose the receiving end of the point-to-point configuration instruction is a first source driver chip, the configuration data carried by the data body of the point-to-point configuration instruction may comprise: the identification of the first source driver chip, the address of a register required to be configured on the first source driver chip, an operational type and data corresponding to the operation indicated by the operational type. The register may be used to store the configuration data received by the first source driver chip. The first source driver chip retrieves configuration data from different register addresses for different operations.

Figure 3:
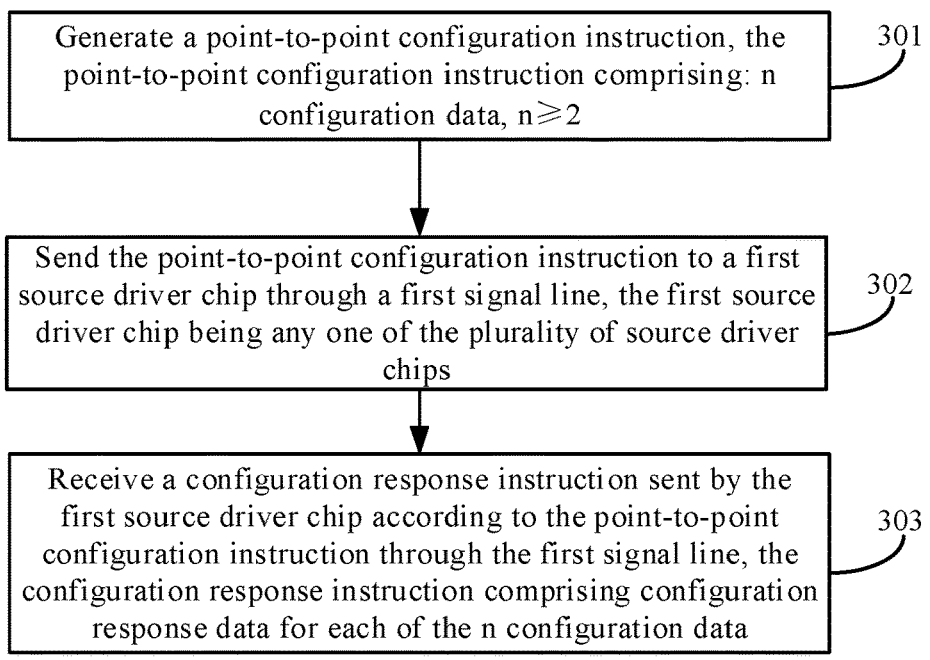
FIG. 3 is a schematic flowchart of a drive control method provided by an exemplary embodiment.

FIG. 3 is a schematic flowchart of a drive control method provided by an exemplary embodiment. The drive control method may be applied to the timer controller in FIG. 1. The timer controller communicates with a plurality of source driver chips connected in parallel through a first signal line. As shown in FIG. 3, the method comprises:

step 301: generating a point-to-point configuration instruction, the point-to-point configuration instruction comprising: n configuration data, n≥2;

step 302: sending the point-to-point configuration instruction to a first source driver chip through a first signal line, the first source driver chip being any one of the plurality of source driver chips; and step 303: receiving a configuration response instruction sent by the first source driver chip according to the point-to-point configuration instruction through the first signal line, the configuration response instruction comprising configuration response data for each of the n configuration data.

In summary, in the drive control method provided by the exemplary embodiment, the point-to-point configuration instruction comprises: n configuration data, and n≥2, i.e., one instruction may carry a plurality of data. The point-to-point configuration instruction sent to the first source driver chip through the first signal line may comprise a plurality of configuration data, which reduces the number of instructions for transmitting a plurality of configuration data, and in turn reduces the number of preambles, start identifiers and stop identifiers needed to be transmitted during the instruction transmission process, therefore improves the data transmission efficiency and utilization rate of the first signal line.

Figure 4:
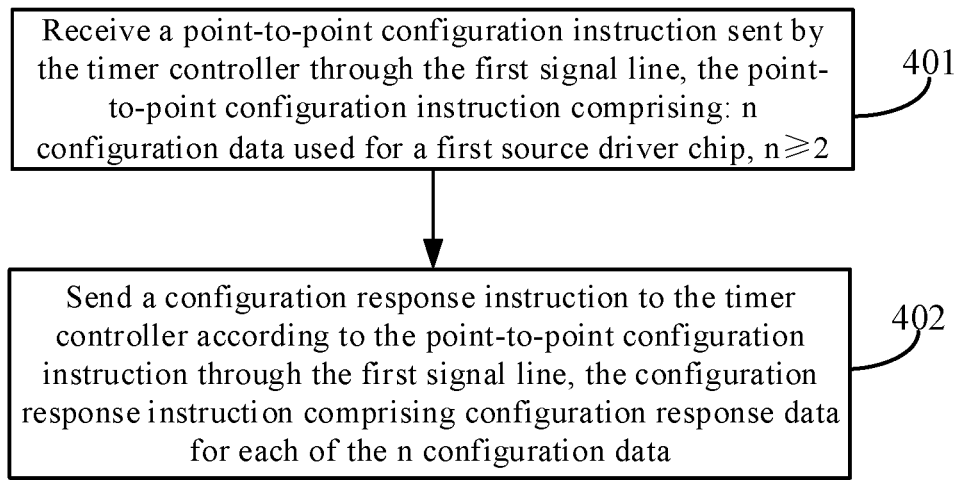
FIG. 4 is a schematic flowchart of another drive control method provided by an exemplary embodiment.

FIG. 4 is a schematic flowchart of another drive control method provided by an exemplary embodiment. The drive control method may be applied to the first source driver chip in FIG. 1, which is any one of the plurality of source driver chips. The plurality of source driver chips is connected in parallel and communicates with a timer controller through a first signal line. As shown in FIG. 4, the method comprises:

step 401: receiving a point-to-point configuration instruction sent by the timer controller through the first signal line, the point-to-point configuration instruction comprising: n configuration data used for a first source driver chip, n≥2; and step 402: sending a configuration response instruction to the timer controller according to the point-to-point configuration instruction through the first signal line, the configuration response instruction comprising configuration response data for each of the n configuration data.

In summary, in the drive control method provided by the exemplary embodiment, the point-to-point configuration instruction comprises: n configuration data, and n≥2, i.e., one instruction may carry a plurality of data. The point-to-point configuration instruction received by the first signal line may comprise a plurality of configuration data, which reduces the number of instructions transmitted at the time of receiving a plurality of configuration data, and in turn reduces the number of preambles, start identifiers and stop identifiers needed to be transmitted, therefore improves the data transmission efficiency and utilization rate of the first signal line.

Figure 5:
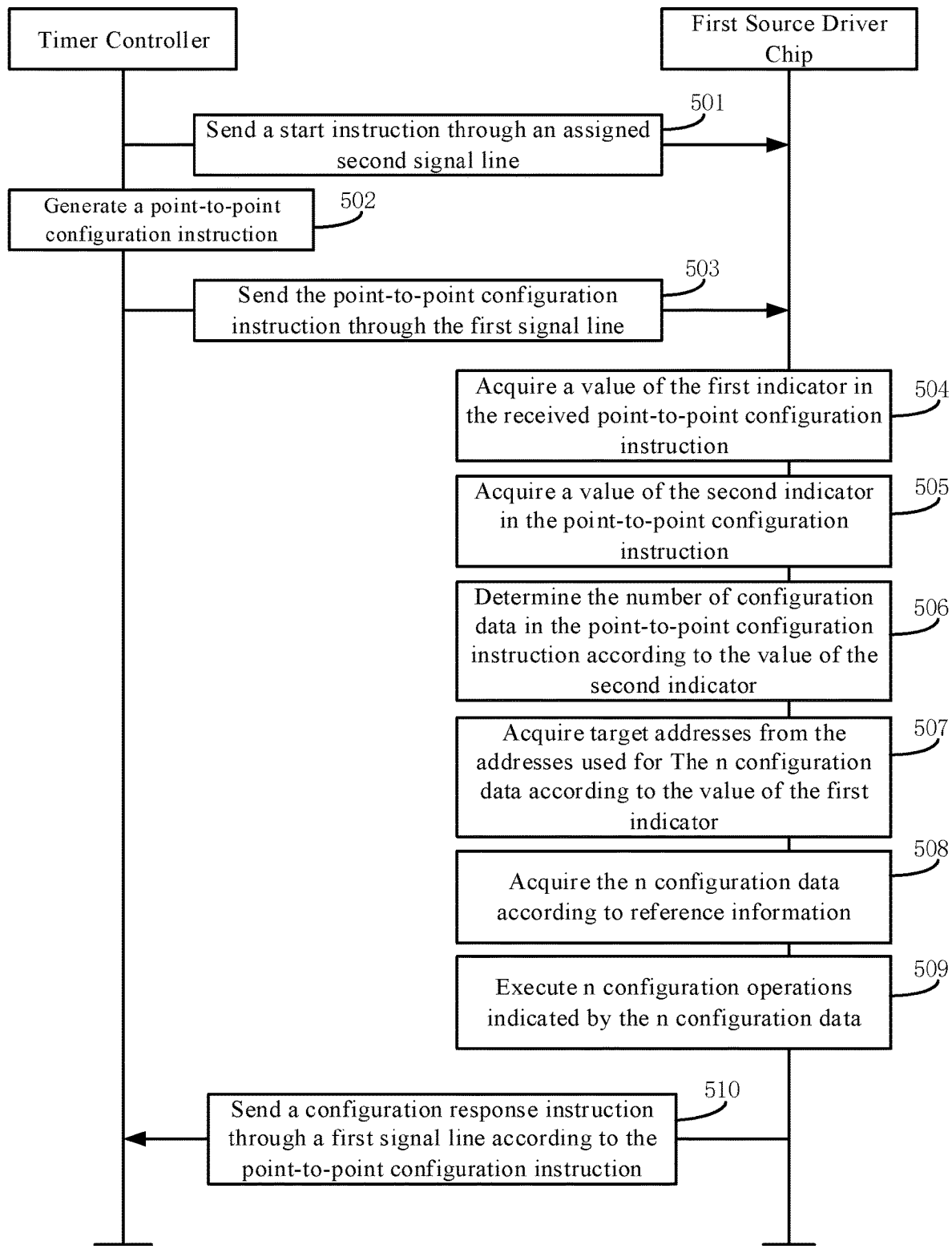
FIG. 5 is a schematic flowchart of a further drive control method provided by an exemplary embodiment.

FIG. 5 is a schematic flowchart of a further drive control method provided by an exemplary embodiment. The drive control method may be applied to the application scenario in FIG. 1. Suppose the first source driver chip is any one of the plurality of source driver chips. The timer controller may be connected with the plurality of source driver chips respectively in a one-to-one relationship through a plurality of second signal lines. The timer controller communicates with the first source driver chip through a second signal line of the plurality of second signal lines that is assigned to the first source driver chip. The method may comprise:

step 501: sending a start instruction by the timer controller to the first source driver chip through the assigned second signal line.

The start instruction may be configured to indicate the largest number of configuration data in the point-to-point configuration instruction to be sent by the timer controller. Exemplarily, the start instruction may comprise at least seven bytes. Four bits of the seventh byte among the at least seven bytes are configured to indicate the largest number, e.g., fifteen largest numbers of configuration data are indicated by fifteen states. Exemplarily, the four bits have sixteen states, wherein one state is an invalid state and the rest fifteen states indicate fifteen largest numbers. For instance, when all the binary digits stored in the four bits are 0, the state represented by the four bits may be an invalid state; or alternatively, when all the binary digits stored in the four bits are 1, the state represented by the four bits may be an invalid state. In addition, the four bits may also be four bits of other byte (such as the sixth byte), and the number of bits may be different (such as three bits), and the embodiments of the present disclosure is not limited thereto.

step 502: Generating a point-to-point configuration instruction by the timer controller.

The point-to-point configuration instruction may be, e.g., the instruction as shown in FIG. 2. Optionally, the point-to-point configuration instruction may comprise: addresses used for configuration data, a first indicator and a data portion. The data portion carries the n configuration data, n≥2. The addresses used for the n configuration data may be register addresses in the first source driver chip that are used for storing configuration data. The first indicator is configured to indicate whether the addresses used for the n configuration data are consecutive. Optionally, the data body may also comprise a second indicator. The second indicator may be configured to indicate the number n of configuration data in the point-to-point configuration instruction. The second indicator may be utilized to directly determine or check whether the number of configuration data in the transmission process is accurate, thereby further avoiding missing of configuration data caused by errors.

Exemplarily, the data body may comprise at least five bytes. The addresses used for the n configuration data may be stored in bits (such as a second bytes) before the fifth bit in the third byte of the data body. The first indicator may comprise: the fifth bit in the third byte among the at least five bytes. The second indicator may comprise: the sixth bit to the eighth bit of the third byte. The data portion may be stored in a byte after the third byte among the at least five bytes.

Moreover, the binary digit stored in the first indicator is 0, which may be configured to indicate that the addresses used for the n configuration data are consecutive; and the binary digit stored in the first indicator is 1, which may be configured to indicate that the addresses used for the n configuration data are not consecutive. If the binary digits stored in the sixth bit to the eighth bit in the third byte of the data body are all 1, the number of configuration data indicated by the second indicator is the largest, which may be 8. If the binary digits stored in the sixth bit to the eighth bit in the third byte are all 0, the number of configuration data indicated by the second indicator is the smallest, which may be 1. If the binary digits stored in the sixth bit to the eighth bit in the third byte are 0, 0, 1 sequentially, the number of configuration data indicated by the second indicator may be 2, and so on. Thus, it is possible to obtain the number of configuration data indicated by respective states of the second indicator.

step 503: Sending the point-to-point configuration instruction by the timer controller to the first source driver chip through the first signal line.

step 504: Acquiring the value of the first indicator in the received point-to-point configuration instruction by the first source driver chip.

Exemplarily, if the first indicator comprises the fifth bit in the third byte of the point-to-point configuration instruction, the first source driver chip may acquire the binary digit stored in the fifth bit, and the binary digit is the value of the first indicator.

step 505: Acquiring the value of the second indicator in the point-to-point configuration instruction by the first source driver chip.

Exemplarily, if the second indicator comprises: the sixth bit to the eighth bit in the third byte of the point-to-point configuration instruction, the first source driver chip may acquire three binary digits stored in the sixth bit to the eighth bit, and the binary number composed of the three binary digits is the value of the second indicator. For instance, if the binary digits stored in the sixth bit to the eighth bit are all 0, the binary number composed of the three binary digits is 000, which is the value of the second indicator.

step 506: Determining the number of configuration data in the point-to-point configuration instruction by the first source driver chip according to the value of the second indicator.

Exemplarily, the value of the second indicator acquired by the first source driver chip in step 505 may be identical with the number of configuration data in the point-to-point configuration instruction. But the embodiment of the present disclosure is not limited thereto. In other embodiments, the value of the second indicator may also be different from the number of configuration data in the point-to-point configuration instruction as long as there is a predetermined correspondence between them. For instance, the number of configuration data in the point-to-point configuration instruction indicated by the value of the second indicator that is 011 may be 4, rather than 3.

step 507: Acquiring target addresses from the addresses used for the n configuration data by the first source driver chip according to the value of the first indicator. The target addresses may indicate the register address used for storing the n configuration data in the configuration instruction.

If, in step 504, the first indicator acquired by the first source driver chip indicates addresses used for the n configuration data are consecutive, the addresses used for the n configuration data may be the first address and the last address of the consecutive addresses. When the n configuration data are stored sequentially, the addresses for n configuration data may be the address of the first configuration data and the address of the last configuration data. Correspondingly, the target addresses may be a segment of consecutive addresses delimited by the first address and the last address. If the first indicator indicates addresses used for the n configuration data are not consecutive, the addresses for n configuration data and correspondingly the target addresses may comprise the address of each of the n configuration data. Since the target addresses acquired by the first source driver chip when the addresses for n configuration data are consecutive are different from those acquired by the first source driver chip when the addresses for n configuration data are not consecutive, and the first source driver chip needs to acquire fewer addresses when the addresses for n configuration data are consecutive, data are transmitted at a faster speed.

Exemplarily, if the first indicator indicates the addresses for n configuration data are consecutive, and the number n of configuration data is 3, when the register addresses for storing the n data are respectively 1, 2 and 3, the addresses for the 3 configuration data in the configuration instruction are 1 and 3. Thus, the first source driver chip will acquire the addresses 1 and 3 from the configuration instruction as the head address and the tail address of the target addresses. If the first indicator indicates the addresses for n configuration data are not consecutive, and the number n of configuration data is 3, when the register addresses for storing the n data are respectively 1, 3 and 4, the addresses for the 3 configuration data in the configuration instruction are all the n addresses corresponding to the n data. Thus, the first source driver chip will acquire each of the addresses used for the n data.

step 508: Acquiring the n configuration data by the first source driver chip according to reference information.

The reference information may comprise target addresses and, optionally, the number of configuration data in the point-to-point configuration instruction (i.e., the value of n). If the addresses for n configuration data are not consecutive, the first source driver chip needs to acquire each configuration data corresponding to the address of the configuration data respectively. If the addresses for n configuration data are consecutive, the first source driver chip only needs to directly acquire the configuration data from the address of the first configuration data to the address of the last configuration data of the n configuration data. Then, the first source driver chip can quickly acquire all the configuration data, thereby resulting in a higher efficiency of configuration data acquisition. The number of configuration data may be used to further verify the accuracy of transmission of configuration data in the configuration instruction.

step 509: Executing n configuration operations indicated by the n configuration data by the first source driver chip.

Exemplarily, the configuration data may comprise: the address of a register required to be configured on the first source driver chip, an operational type and data corresponding to the operation indicated by the operational type. The configuration operation corresponding to the configuration data may be a read operation or a write operation.

step 510: Sending a configuration response instruction to a timer controller by the first source driver chip through a first signal line according to the point-to-point configuration instruction.

The specific structure of the configuration response instruction may be the structure of the instruction as shown in FIG. 2. In addition, the configuration response instruction may comprise configuration response data for each configuration data in the n configuration data. The configuration response data for each configuration data may be configured to indicate whether the configuration operation indicated by each configuration data is completed. For instance, when the configuration operation indicated by certain configuration data has been completed, the configuration response data corresponding to the configuration data may be 1. When the configuration operation indicated by certain configuration data has not been completed, the configuration response data corresponding to the configuration data may be 0, and at this time, the timer controller may re-send a point-to-point configuration instruction to the first source driver chip.

Optionally, after receiving the point-to-point configuration instruction, the first source driver chip may send the configuration response instruction to the timer controller through the first signal line after a preset waiting time for reply. In addition, the interval between two adjacent instructions sent by the timer controller is called suspend time or standby time. The waiting time for reply of the first source driver chip may be larger than the suspend time, so as to prevent the first source driver chip from sending a next instruction when transmission of the instruction sent by the timer controller has not been finished yet, which may cause line conflict otherwise. Thus, the waiting time for reply may be larger than the suspend time. The suspend time may be 10 microseconds (μs), and correspondingly, the waiting time for reply may be larger than 10 microseconds.

It should be noted that the first signal line may be called a bidirectional instruction channel (BCC) signal line. The point-to-point configuration instruction and the configuration response instruction may both be called a BCC instruction.

In summary, in the drive control method provided by the exemplary embodiment, the point-to-point configuration instruction comprises: n configuration data, and n≥2, i.e., one instruction may carry a plurality of data. The point-to-point configuration instruction sent to the first source driver chip through the first signal line may comprise a plurality of configuration data, which reduces the number of instructions for transmitting a plurality of configuration data, and in turn reduces the number of preambles, start identifiers and stop identifiers needed to be transmitted, therefore improves the data transmission efficiency and utilization rate of the first signal line.

Figure 6:
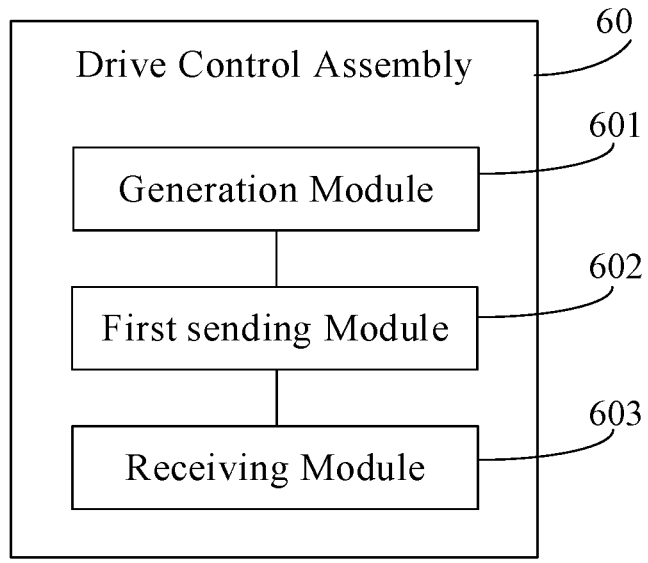
FIG. 6 is a structural schematic diagram of a drive control assembly provided by an exemplary embodiment.

FIG. 6 is a structural schematic diagram of a drive control assembly provided by an embodiment of the present disclosure. The drive control assembly is applied to a timer controller. The timer controller communicates with a plurality of source driver chips connected in parallel through a first signal line. The drive control assembly 60 may comprise:

a generation module 601 configured to generate a point-to-point configuration instruction that comprises n configuration data, n≥2;

a first sending module 602 configured to send the point-to-point configuration instruction to a first source driver chip through the first signal line, the first source driver chip being any one of the plurality of source driver chips; and a receiving module 603 configured to receive a configuration response instruction sent by the first source driver chip according to the point-to-point configuration instruction through the first signal line. The configuration response instruction comprises configuration response data for each of the n configuration data.

In summary, in the drive control assembly provided by the exemplary embodiment, the point-to-point configuration instruction comprises: n configuration data, and n≥2, i.e., one instruction may carry a plurality of configuration data. The point-to-point configuration instruction sent to the first source driver chip by the first sending module through the first signal line may comprise a plurality of configuration data, which reduces the number of instructions for transmitting a plurality of configuration data, and in turn reduces the number of preambles, start identifiers and stop identifiers needed to be transmitted, therefore improves the data transmission efficiency and utilization rate of the first signal line.

Optionally, the point-to-point configuration instruction comprises: addresses used for the n configuration data, a first indicator and a data portion. The first indicator is configured to indicate whether the addresses used for the n configuration data are consecutive. The data portion carries the n configuration data.

Optionally, the point-to-point configuration instruction further comprises a second indicator. The second indicator is configured to indicate the number of configuration data in the point-to-point configuration instruction.

Optionally, the point-to-point configuration instruction comprises at least five bytes. The first indicator comprises the fifth bit of the third byte among the at least five bytes. The second indicator comprises the sixth bit to the eighth bit of the third byte.

Figure 7:
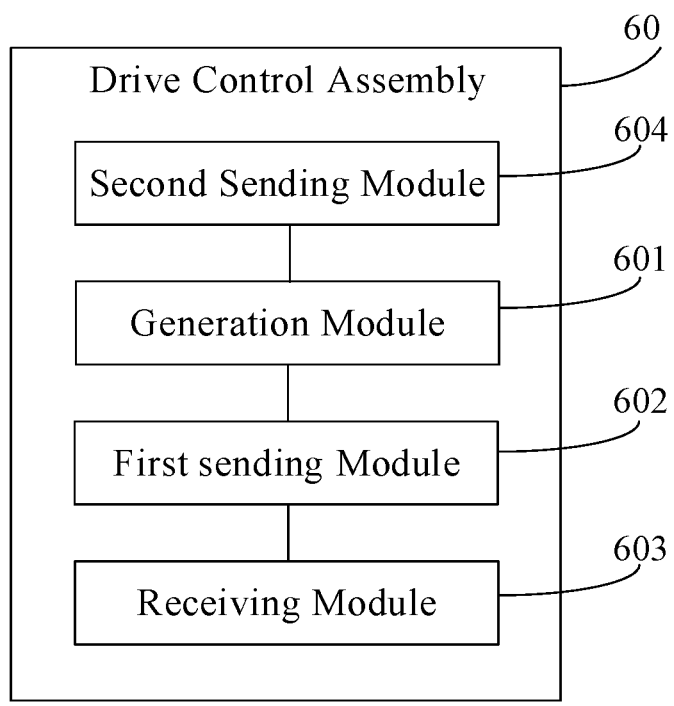
FIG. 7 is a structural schematic diagram of another drive control assembly provided by an exemplary embodiment.

Optionally, the timer controller connects with the plurality of source driver chips respectively in a one-to-one relationship through a plurality of second signal lines, and the timer controller connects with the first source driver chip through a target second signal line of the plurality of second signal lines. FIG. 7 is a structural schematic diagram of another drive control assembly provided by an exemplary embodiment. As shown in FIG. 7, in addition to the modules shown in FIG. 6, the drive control assembly 60 further comprises:

a second sending module 604 configured to send a start instruction to the first source driver chip through the target second signal line, the start instruction being configured to indicate the largest number of configuration data carried by the point-to-point configuration instruction.

Optionally, the start instruction comprises at least seven bytes. Four bits of the seventh byte among the at least seven bytes are configured to indicate fifteen largest numbers by, e.g., fifteen states.

Optionally, the point-to-point configuration instruction and the configuration response instruction each comprise a preamble, a start identifier, a data body and a stop identifier that are sequentially arranged.

The preamble comprises a first signal of at least eight consecutive bit periods, each of the bit periods being two microseconds. The start identifier comprises a second signal of at least two consecutive bit periods. The stop identifier comprises a third signal of at least two consecutive bit periods.

The first signal, the second signal, the n configuration data and the configuration response data thereof are all obtained by Manchester encoding, and transition of the first signal is from a low level to a high level, transition of the second signal is from a low level to a high level, and transition of the third signal is from a high level to a low level.

In summary, in the drive control assembly provided by the exemplary embodiment, the point-to-point configuration instruction comprises: n configuration data, and n≥2, i.e., one instruction may carry a plurality of configuration data. The point-to-point configuration instruction sent to the first source driver chip by the first sending module through the first signal line may comprise a plurality of configuration data, which reduces the number of instructions for transmitting a plurality of configuration data, and in turn reduces the number of preambles, start identifiers and stop identifiers needed to be transmitted, therefore improves the data transmission efficiency and utilization rate of the first signal line.

Figure 8:
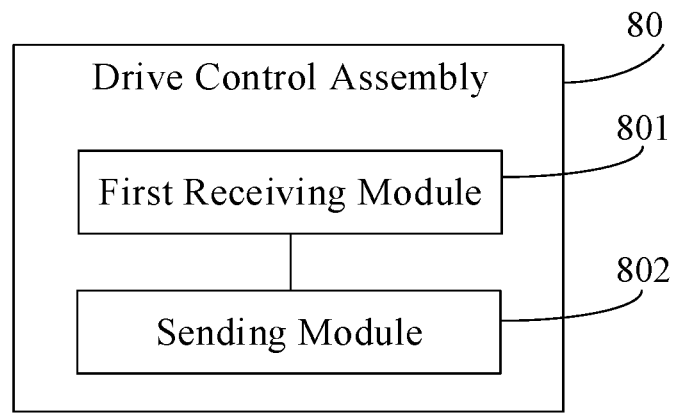
FIG. 8 is a structural schematic diagram of a further drive control assembly provided by an exemplary embodiment.

FIG. 8 is a structural schematic diagram of a further drive control assembly provided by an exemplary embodiment. The drive control assembly is applied to a first source driver chip. The first source driver chip is any one of a plurality of source driver chips. The plurality of source driver chips is connected in parallel and communicates with a timer controller through a first signal line. The drive control assembly 80 may comprise:

a first receiving module 801 configured to receive a point-to-point configuration instruction sent by the timer controller through the first signal line, the point-to-point configuration instruction comprising: n configuration data used for a first source driver chip, n 2; and a sending module 802 configured to send a configuration response instruction to the timer controller according to the point-to-point configuration instruction through the first signal line, the configuration response instruction comprising: configuration response data for each of the n configuration data.

In summary, in the drive control assembly provided by the exemplary embodiment, the point-to-point configuration instruction comprises: n configuration data, and n≥2, i.e., one instruction may carry a plurality of configuration data. The point-to-point configuration instruction received by the first receiving module through the first signal line may comprise a plurality of configuration data, which reduces the number of instructions transmitted for receiving a plurality of configuration data, and in turn reduces the number of preambles, start identifiers and stop identifiers needed to be transmitted, therefore improves the data transmission efficiency and utilization rate of the first signal line.

Figure 9:
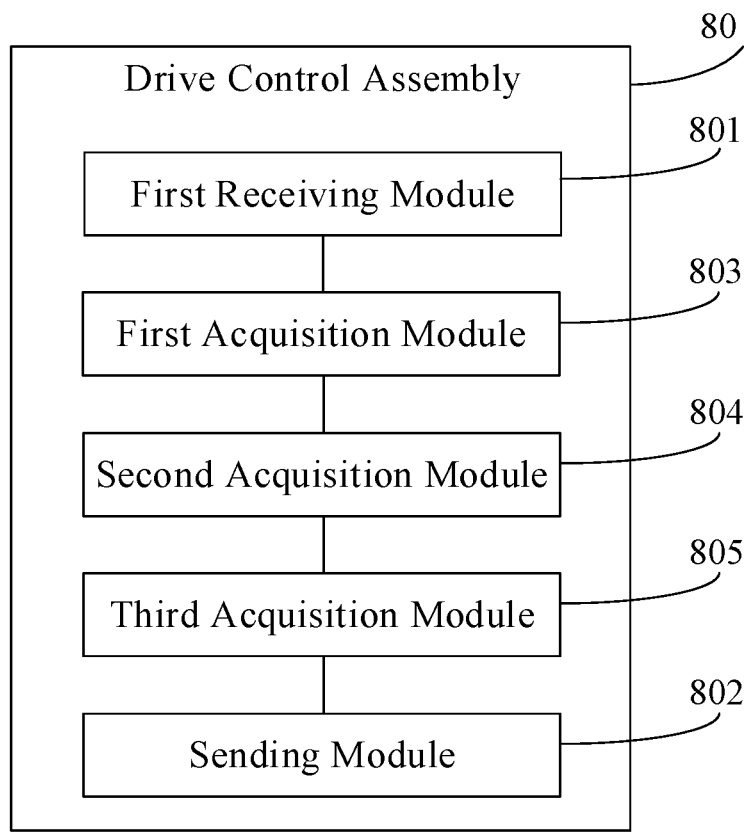
FIG. 9 is a structural schematic diagram of a still further drive control assembly provided by an exemplary embodiment.

Optionally, the point-to-point configuration instruction comprises addresses used for the n configuration data, a first indicator and a data portion. FIG. 9 is a structural schematic diagram of yet another drive control assembly provided by an exemplary embodiment. In addition to the modules shown in FIG. 8, the drive control assembly 80 further comprises:

a first acquisition module 803 configured to acquire the value of the first indicator, the first indicator being configured to indicate whether the addresses used for the n configuration data are consecutive, the data portion carrying the n configuration data;

a second acquisition module 804 configured to acquire target addresses from the addresses used for the n configuration data according to the value of the first indicator, wherein when the first indicator indicates the addresses used for the n configuration data are consecutive, the target addresses comprise the address of the first configuration data of the n configuration data and the address of the last configuration data thereof; and when the first indicator is configured to indicate the addresses used for the n configuration data are not consecutive, the target addresses comprise the address of each of the n configuration data; and a third acquisition module 805 configured to acquire the n configuration data carried by the data portion according to reference information, the reference information comprising the target addresses.

Figure 10:
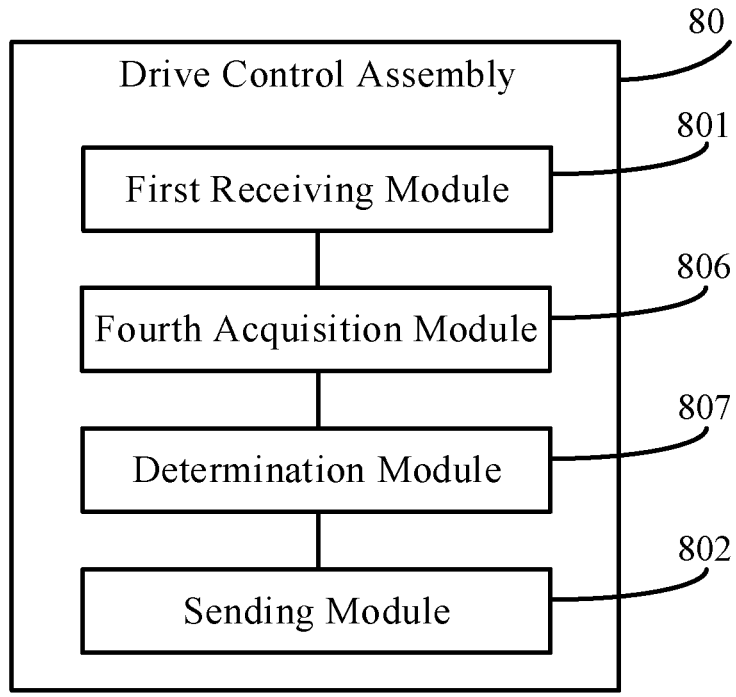
FIG. 10 is a structural schematic diagram of a drive control assembly provided by another exemplary embodiment.

Optionally, the point-to-point configuration instruction further comprises a second indicator. FIG. 10 is a structural schematic diagram of a drive control assembly provided by another exemplary embodiment. In addition to the modules shown in FIG. 8, the drive control assembly 80 further comprises:

a fourth acquisition module 806 configured to acquire the value of the second indicator, the second indicator being configured to indicate the number of configuration data in the point-to-point configuration instruction; and a determination module 807 configured to determine the number of configuration data in the point-to-point configuration instruction according to the value of the second indicator, the reference information further comprising the number.

Optionally, the point-to-point configuration instruction comprises at least five bytes. The first indicator comprises the fifth bit of the third byte among the at least five bytes. The second indicator comprises the sixth bit to the eighth bit of the third byte among the at least five bytes.

Figure 11:
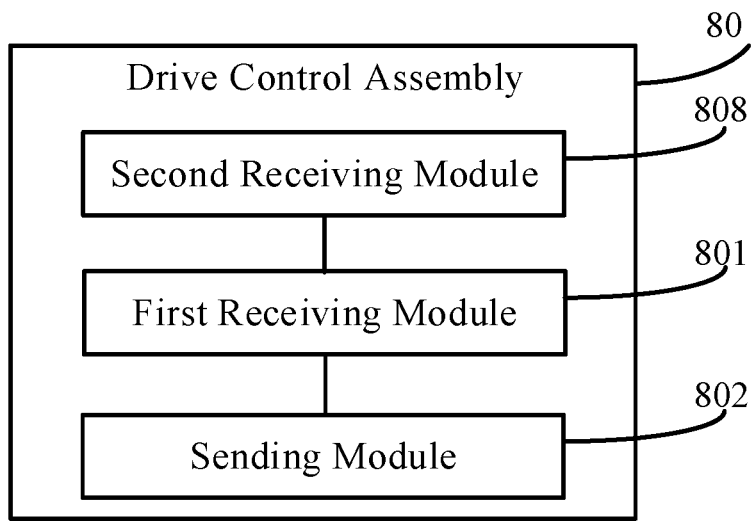
FIG. 11 is a structural schematic diagram of another drive control assembly provided by another exemplary embodiment.

Optionally, the timer controller connects with the plurality of source driver chips respectively in a one-to-one relationship through a plurality of second signal lines, and the timer controller connects with the first source driver chip through a target second signal line of the plurality of second signal lines. FIG. 11 is a structural schematic diagram of another drive control assembly provided by another exemplary embodiment. In addition to the modules shown in FIG. 8, the drive control assembly 80 further comprises:

a second receiving module 808 configured to receive a start instruction sent by the timer controller through the target second signal line, the start instruction being configured to indicate the largest number of configuration data carried by the point-to-point configuration instruction.

Optionally, the start instruction comprises at least seven bytes. Four bits of the seventh byte among the at least seven bytes are configured to indicate fifteen largest numbers by means of fifteen states.

Optionally, the point-to-point configuration instruction and the configuration response instruction each comprise a preamble, a start identifier, a data body and a stop identifier that are sequentially arranged.

The preamble comprises a first signal of at least eight consecutive bit periods, each of the bit periods being two microseconds. The start identifier comprises a second signal of at least two consecutive bit periods. The stop identifier comprises a third signal of at least two consecutive bit periods.

The first signal, the second signal, the n configuration data and the configuration response data thereof are all obtained by Manchester encoding, and transition of the first signal is from a low level to a high level, transition of the second signal is from a low level to a high level, and transition of the third signal is from a high level to a low level.

In summary, in the drive control assembly provided by the exemplary embodiments, the point-to-point configuration instruction comprises: n configuration data, and n≥2, i.e., one instruction may carry a plurality of configuration data. The point-to-point configuration instruction received by the first receiving module through the first signal line may comprise a plurality of configuration data, which reduces the number of instructions transmitted for receiving a plurality of configuration data, and in turn reduces the number of preambles, start identifiers and stop identifiers needed to be transmitted, therefore improves the data transmission efficiency and utilization rate of the first signal line.

Another exemplary embodiment provides a further drive control assembly, comprising a memory, a processor and a computer program stored in the memory and executable in the processor, wherein when executing the program, the processor implements the steps of the drive control method executed by the timer controller or the source driver chip.

The exemplary embodiment further provides a computer readable storage medium having a computer program stored thereon, wherein the program, when executed by the processor, implements the steps of the drive control method executed by the timer controller or the source driver chip. The computer readable storage medium may be a non-transitory computer readable storage medium.

The exemplary embodiment further provides a chip comprising a programmable logic circuit and/or a program instruction that is configured to implement the steps of the drive control method executed by the timer controller or the source driver chip when the chip operates.

The exemplary embodiment provides a display device, comprising a timer controller and a source driver chip, which may be connected as shown in FIG. 1. The timer controller and the source driver chip both may comprise a corresponding drive control assembly.

The drive control assembly in the timer controller is shown in FIG. 6 or 7, and the drive control assembly in the source driver chip is any one shown in FIGS. 8 to 11.

Alternatively, the drive control assembly in the timer controller comprises a memory, a processor and a computer program stored in the memory and executable in the processor, wherein when executing the program, the processor implements the steps of the drive control method executed by the timer controller. The drive control assembly in the source driver chip comprises a memory, a processor and a computer program stored in the memory and executable in the processor, wherein when executing the program, the processor implements the steps of the drive control method executed by the first source driver chip.

The display device may be any product or component having a display function such as an LCD panel, electronic paper, an organic light-emitting diode (OLED) panel, a mobile phone, a table computer, a TV, a display, a laptop, a digital frame, or a navigator.

It should be noted that the term "and/or" in the exemplary embodiments only describes an association relationship between associated objects, and means there may exist three relationships. For instance, A and/or B may indicate the presence of A alone, A and B, or B alone. In addition, the character "/" herein generally means the objects before and after it is in an "or" relationship.

The order of the steps of the drive control method provided by the exemplary embodiment may be adjusted appropriately, and the steps may also be added or reduced accordingly. Any variant method that would be readily envisaged by any technician skilled in the art within the technical scope disclosed in the present disclosure should be covered by the scope of protection of the present disclosure. A technician skilled in the art would clearly understand that, for the sake of easy and concise description, reference may be made to the corresponding process of the exemplary embodiments of the methods mentioned above for the specific operation process of the devices, assemblies and modules as described above.

Modules in various exemplary embodiments may be implemented using hardware units, software units, or a combination thereof. Examples of hardware units may comprise equipment, components, processors, microprocessors, circuits, circuit elements (e.g., transistors, resistors, capacitors, inductors, etc.), integrated circuits, application specific integrated circuits (ASICs), programmable logic devices (PLDs), digital signal processors (DSPs), field programmable gate arrays (FPGAs), memory cells, logic gates, registers, semiconductor devices, chips, microchips, chipsets, and the like. Examples of software units may comprise software components, programs, applications, computer programs, application programs, system programs, machine programs, operating system software, middleware, firmware, software modules, routines, subroutines, functions, methods, processes, software interface, application programming interface (API), instruction sets, calculation codes, computer codes, code segments, computer code segments, words, values, symbols, or any combination thereof. Determining whether an exemplary embodiment is implemented by using hardware units and/or software units may vary depending on any number of factors desired for a given implementation, such as desired calculation rate, power level, heat resistance, processing cycle budget, input data rate, output data rate, memory resource, data bus speed, and other design or performance constraint, and the like.

Those skilled in the art may easily conceive other embodiments of the present disclosure after considering the specification and practicing what is disclosed herein. The present disclosure is intended to cover any variations, uses, or adaptations of the present disclosure, which are in accordance with the general principles of the present disclosure and comprise common general knowledge or conventional technical means in the art that are not disclosed in the present disclosure. The specification and exemplary embodiments are to be regarded as illustrative only. The real scope and spirit of the present disclosure are indicated by the claims.

It should be understood that the present disclosure is not limited to the precise structures that have been described above and shown in the drawings, and various modifications and changes can be made without departing from the scope thereof. The scope of the disclosure is to be limited only by the appended claims.

The invention claimed is:

1. A drive control method being applied to a timer controller that communicates with a plurality of source driver chips connected in parallel through a first signal line, the method comprising:
   generating a point-to-point configuration instruction that comprises n configuration data, n≥2;
   sending the point-to-point configuration instruction to a first source driver chip through the first signal line, the first source driver chip being any one of the plurality of source driver chips; and
   receiving a configuration response instruction sent by the first source driver chip according to the point-to-point configuration instruction through the first signal line, the configuration response instruction comprising configuration response data for each of the n configuration data;
   wherein the point-to-point configuration instruction comprises addresses used for the n configuration data, a first indicator and a data portion, wherein the first indicator is configured to indicate whether the addresses used for the n configuration data are consecutive and the value of the first indicator is used for acquiring target addresses from the addresses used for the n configuration data, and the data portion carries the n configuration data;
   wherein when the first indicator indicates the addresses used for the n configuration data are consecutive, the addresses used for the n configuration data comprise the first address and the last address of the consecutive addresses, and the target addresses comprise a segment of consecutive addresses delimited by the first address and the last address; and when the first indicator indicates the addresses used for the n configuration data are not consecutive, the target addresses comprise the address of each of the n configuration data.

2. The method according to claim 1, wherein the point-to-point configuration instruction further comprises a second indicator that is configured to indicate the number of configuration data in the point-to-point configuration instruction.

3. The method according to claim 1, wherein the timer controller connects with the plurality of source driver chips respectively in a one-to-one relationship through a plurality of second signal lines, and the timer controller connects with the first source driver chip through a second signal line of the plurality of second signal lines that is assigned to the first source driver chip, and before generating a point-to-point configuration instruction, the method further comprises:
   sending a start instruction to the first source driver chip through the assigned second signal line for indicating the largest number of configuration data carried by the point-to-point configuration instruction.

4. The method according to claim 1, wherein the point-to-point configuration instruction and the configuration response instruction each comprise a preamble, a start identifier, a data body and a stop identifier that are sequentially arranged,
   the preamble comprises a first signal of at least eight consecutive bit periods, each of the bit periods being two microseconds; the start identifier comprises a second signal of at least two consecutive bit periods; the data body comprises the n configuration data or n configuration response data; and the stop identifier comprises a third signal of at least two consecutive bit periods; and
   the first signal, the second signal, the n configuration data and the configuration response data thereof are all obtained by Manchester encoding.

5. A drive control assembly for performing a method according to claim 1, the drive control assembly comprising:
   a generator configured to generate a point-to-point configuration instruction that comprises n configuration data, n≥2;
   a first sender configured to send the point-to-point configuration instruction to a first source driver chip through the first signal line, the first source driver chip being any one of the plurality of source driver chips; and
   a receiver configured to receive a configuration response instruction sent by the first source driver chip according to the point-to-point configuration instruction through the first signal line, the configuration response instruction comprising configuration response data for each of the n configuration data.

6. The drive control assembly according to claim 5, wherein the timer controller connects with the plurality of source driver chips respectively in a one-to-one relationship through a plurality of second signal lines, and the timer controller connects with the first source driver chip through a second signal line of the plurality of second signal lines that is assigned to the first source driver chip, the drive control assembly further comprises:
   a second sender configured to send a start instruction to the first source driver chip through the assigned second signal line, the start instruction being configured to indicate the largest number of configuration data carried by the point-to-point configuration instruction.

7. A display device, comprising a timer controller and a first source driver chip,
   wherein the timer controller comprises a drive control assembly according to claim 5, and
   the first source driver chip comprises:
   a first receiver configured to receive the point-to-point configuration instruction sent by the timer controller through the first signal line;
   a sender configured to send the configuration response instruction to the timer controller according to the point-to-point configuration instruction through the first signal line;
   a first acquirer configured to acquire the value of the first indicator;
   a second acquirer configured to acquire the target addresses from the addresses used for the n configuration data according to the value of the first indicator; and
   a third acquirer configured to acquire the n configuration data carried by the data portion according to reference information, the reference information comprising the target addresses.

8. A drive control assembly, comprising a memory, a processor and a computer program stored in the memory and executable in the processor, wherein when executing the computer program, the processor implements the method according to claim 1.

9. A non-transitory computer readable storage medium having a computer program stored thereon, wherein the computer program, when executed by a processor, causes the processor to implement the method according to claim 1.

10. A drive control method being applied to a first source driver chip, the first source driver chip being any one of a plurality of source driver chips that is connected in parallel and communicates with a timer controller through a first signal line, the method comprises:
receiving a point-to-point configuration instruction sent by the timer controller through the first signal line, the point-to-point configuration instruction comprising: n configuration data used for a first source driver chip, n≥2; and
sending a configuration response instruction to the timer controller according to the point-to-point configuration instruction through the first signal line, the configuration response instruction comprising configuration response data for each of the n configuration data;
wherein the point-to-point configuration instruction comprises addresses used for the n configuration data, a first indicator and a data portion, and before sending a configuration response instruction to the timer controller according to the point-to-point configuration instruction through the first signal line, the method further comprises:
acquiring a value of the first indicator, the first indicator being configured to indicate whether the addresses used for the n configuration data are consecutive, the data portion carrying the n configuration data;
acquiring target addresses from the addresses used for the n configuration data according to the value of the first indicator, wherein when the first indicator indicates the addresses used for the n configuration data are consecutive, the addresses used for the n configuration data comprise the first address and the last address of the consecutive addresses, and the acquired target addresses comprise a segment of consecutive addresses delimited by the first address and the last address; and when the first indicator indicates the addresses used for the n configuration data are not consecutive, the acquired target addresses comprise the address of each of then configuration data; and
acquiring the n configuration data carried by the data portion according to reference information, the reference information comprising the target addresses.

11. The method according to claim 10, wherein the point-to-point configuration instruction further comprises a second indicator, and before acquiring the n configuration data carried by the data portion according to reference information, the method further comprises:
acquiring a value of the second indicator, the second indicator being configured to indicate the number of configuration data in the point-to-point configuration instruction; and
determining the number according to the value of the second indicator, the reference information further comprising the number.

12. The method according to claim 10, wherein the timer controller connects with the plurality of source driver chips respectively in a one-to-one relationship through a plurality of second signal lines, and the timer controller connects with the first source driver chip through a second signal line of the plurality of second signal lines that is assigned to the first source driver chip, and
before sending a configuration response instruction to the timer controller according to the point-to-point configuration instruction through the first signal line, the method further comprises:
receiving a start instruction sent by the timer controller through the assigned second signal line, the start instruction being configured to indicate the largest number of configuration data carried by the point-to-point configuration instruction.

13. A drive control assembly for performing a method according to claim 10, the drive control assembly comprising:
a first receiver configured to receive a point-to-point configuration instruction sent by the timer controller through the first signal line, the point-to-point configuration instruction comprising: n configuration data used for a first source driver chip, n≥2;
a sender configured to send a configuration response instruction to the timer controller according to the point-to-point configuration instruction through the first signal line, the configuration response instruction comprising configuration response data for each of the n configuration data;
a first acquirer configured to acquire a value of the first indicator;
a second acquirer configured to acquire target addresses from the addresses used for the n configuration data according to the value of the first indicator; and
a third acquirer configured to acquire the n configuration data carried by the data portion according to reference information, the reference information comprising the target addresses.

14. The drive control assembly according to claim 13, wherein the point-to-point configuration instruction further comprises a second indicator, the drive control assembly further comprises:
a fourth acquirer configured to acquire a value of the second indicator, the second indicator being configured to indicate the number of configuration data in the point-to-point configuration instruction; and
a determination module configured to determine the number according to the value of the second indicator, the reference information further comprising the number.

15. The drive control assembly according to claim 13, wherein the timer controller connects with the plurality of source driver chips respectively in a one-to-one relationship through a plurality of second signal lines, and the timer controller connects with the first source driver chip through a second signal line of the plurality of second signal lines that is assigned to the first source driver chip, the drive control assembly further comprises:
a second receiver configured to receive a start instruction sent by the timer controller through the assigned second signal line, the start instruction being configured to indicate the largest number of configuration data carried by the point-to-point configuration instruction.

16. A drive control assembly, comprising a memory, a processor and a computer program stored in the memory and executable in the processor, wherein when executing the computer program, the processor implements the method according to claim 10.

17. A non-transitory computer readable storage medium having a computer program stored thereon, wherein the computer program, when executed by a processor, causes the processor to implement the method according to claim 10.

\* \* \* \* \*